United States Patent
Wu et al.

(10) Patent No.: US 9,727,419 B2
(45) Date of Patent: Aug. 8, 2017

(54) NON-BINARY LOW DENSITY PARITY CHECK CODE COLUMN ROTATION

(71) Applicant: Avago Technologies General IP (Singapore) Pte. Ltd., Singapore (SG)

(72) Inventors: Xuebin Wu, San Jose, CA (US); Yang Han, Sunnyvale, CA (US); Shaohua Yang, San Jose, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 35 days.

(21) Appl. No.: 14/935,333

(22) Filed: Nov. 6, 2015

(65) Prior Publication Data

US 2017/0132077 A1    May 11, 2017

(51) Int. Cl.
| | | |
|---|---|---|
| G11C 29/00 | (2006.01) | |
| G06F 11/10 | (2006.01) | |
| H03M 13/11 | (2006.01) | |
| H03M 13/00 | (2006.01) | |

(52) U.S. Cl.
CPC ..... G06F 11/1076 (2013.01); H03M 13/1102 (2013.01); H03M 13/616 (2013.01)

(58) Field of Classification Search
None
See application file for complete search history.

(56) References Cited

U.S. PATENT DOCUMENTS

| | | | | |
|---|---|---|---|---|
| 7,644,336 B2 * | 1/2010 | Yang | .................. | H03M 13/1197 375/298 |
| 7,917,827 B2 * | 3/2011 | Chung | .................. | H03M 13/03 714/752 |
| 2002/0162072 A1 * | 10/2002 | Thesling, III | ..... | H03M 13/2742 714/777 |
| 2013/0080844 A1 * | 3/2013 | Xu | ........................ | H04L 1/0071 714/54 |
| 2013/0275827 A1 * | 10/2013 | Wang | .................. | G06F 11/1076 714/752 |
| 2014/0053037 A1 * | 2/2014 | Wang | .................... | H03M 13/13 714/752 |
| 2016/0261371 A1 * | 9/2016 | Klenner | ............. | H03M 13/1165 |

FOREIGN PATENT DOCUMENTS

EP        2690791 A1    1/2015

OTHER PUBLICATIONS

Kiyani, "Optimized Rotations for LDPC-Coded Gray-Mapped MPSK Constellations With Signal Space Diversity", 0-7803-9785-1/06, IEEE, 2006.

\* cited by examiner

*Primary Examiner* — Daniel McMahon
(74) *Attorney, Agent, or Firm* — Sheridan Ross P.C.

(57) ABSTRACT

An apparatus for processing data includes a storage medium operable to store encoded data, and a read channel circuit with a low density parity check encoder operable to encode data to generate the encoded data, and a low density parity check decoder operable to decode the encoded data retrieved from the storage medium. The read channel circuit is operable to perform a column rotation on the encoded data prior to storage and after retrieval before decoding.

20 Claims, 5 Drawing Sheets

NON-BINARY LOW DENSITY PARITY CHECK CODE COLUMN ROTATION

FIELD OF THE INVENTION

Various embodiments of the present invention provide systems and methods for processing data, and more particularly to systems and methods for a low density parity check encoding and decoding with column rotations.

BACKGROUND

Various data processing systems have been developed including storage systems, cellular telephone systems, and radio transmission systems. In such systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, parity bits can be added to groups of data bits, ensuring that the groups of data bits (including the parity bits) have either even or odd numbers of ones. The parity bits can be used in error correction systems, including in Low Density Parity Check (LDPC) decoders. However, the design of an LDPC code used to encode data can be focused on particular channel conditions, and that LDPC code may not yield optimal results in a data processing systems used with a variety of different channel conditions.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components.

DETAILED DESCRIPTION OF THE INVENTION

Embodiments of the present invention are related to encoding and decoding of data using non-binary low density parity check (LDPC) codes with column rotation. Non-binary low density parity check codes have been used in communication and storage systems for improved performance, especially in the presence of noise bursts. However, for different channel conditions, the nature of error events is different. At high channel bit density conditions, errors are more likely to be grouped than in low channel bit density conditions. Different low density parity check codes can be designed to be more effective in different channel conditions. Applying column rotations to the parity check H-matrix for the low density parity check code (or, equivalently in some embodiments, to low density parity check codeword data) enables a data processing system to effectively apply different low density parity check codes in different channel conditions without requiring multiple low density parity check codes in the system. By designing a low density parity check code which, after various column rotations, performs well in the different expected channel conditions, the data processing system can provide the superior performance of multiple low density parity check codes without the size, complexity or design difficulty of multiple low density parity check codes.

Column rotations in a non-binary low density parity check system are performed by multiplying columns in the H-matrix by a constant from a Galois finite field. Notably, column rotations do not change the topology property of the low density parity check code, such as cycle structures, trapping set structures, etc. Column rotation does change algebraic values which changes the binary image, such as the Hamming weight of trapping sets.

Low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 1:
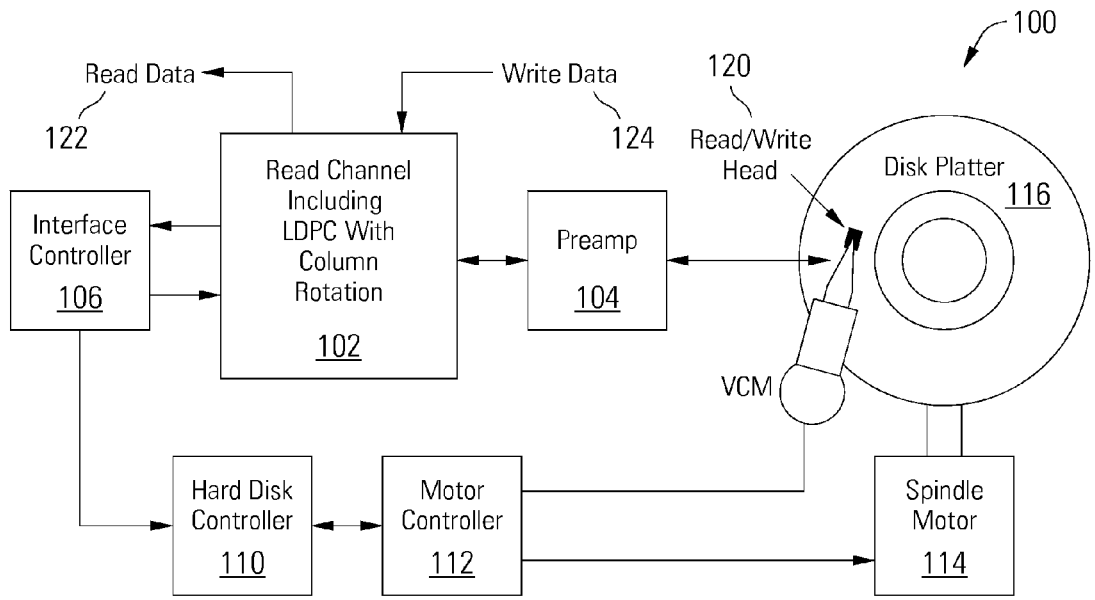
FIG. 1 depicts a storage system including a read channel with low density parity check encoding and decoding with column rotation in accordance with some embodiments of the present invention.
Figure 2:
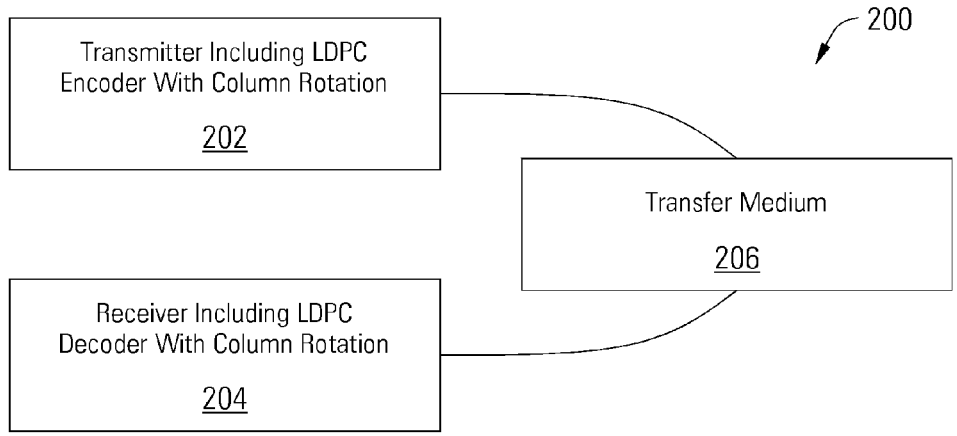
FIG. 2 depicts a wireless communication system including a receiver with low density parity check encoding and decoding with column rotation in accordance with some embodiments of the present invention.
Figure 3:
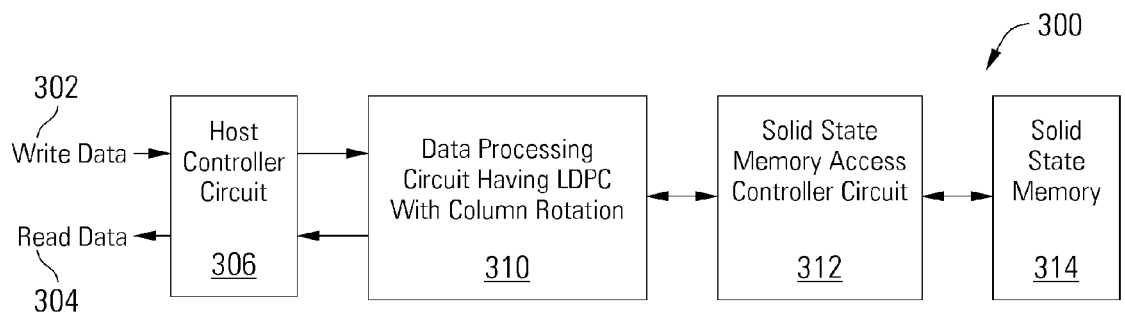
FIG. 3 depicts another storage system including a data processing circuit having low density parity check encoding and decoding with column rotation in accordance with some embodiments of the present invention.

Although the low density parity check encoding and decoding with column rotation disclosed herein is not limited to any particular application, several example applications are disclosed in FIGS. 1-3 that benefit from embodiments of the present invention. Turning to FIG. 1, a storage system 100 is illustrated as an example application of low density parity check encoding and decoding with column rotation in accordance with some embodiments of the present invention. The storage system 100 includes a read channel circuit 102 with a low density parity check encoder and decoder with embedded or external column rotation circuits in accordance with one or more embodiments of the present invention. Storage system 100 may be, for example, a hard disk drive. Storage system 100 also includes a preamplifier 104, an interface controller 106, a hard disk controller 110, a motor controller 112, a spindle motor 114, a disk platter 116, and a read/write head assembly 120. Interface controller 106 controls addressing and timing of data to/from disk platter 116. The data on disk platter 116 consists of groups of magnetic signals that may be detected by read/write head assembly 120 when the assembly is properly positioned over disk platter 116. In one embodiment, disk platter 116 includes magnetic signals recorded in accordance with either a longitudinal or a perpendicular recording scheme.

In a typical read operation, read/write head assembly 120 is accurately positioned by motor controller 112 over a desired data track on disk platter 116. Motor controller 112 both positions read/write head assembly 120 in relation to disk platter 116 and drives spindle motor 114 by moving read/write head assembly 120 to the proper data track on disk platter 116 under the direction of hard disk controller 110. Spindle motor 114 spins disk platter 116 at a determined spin rate (RPMs). Once read/write head assembly 120 is positioned adjacent the proper data track, magnetic signals representing data on disk platter 116 are sensed by read/write head assembly 120 as disk platter 116 is rotated by spindle motor 114. The sensed magnetic signals are provided as a continuous, minute analog signal representative of the magnetic data on disk platter 116. This minute analog signal is transferred from read/write head assembly 120 to read channel circuit 102 via preamplifier 104. Preamplifier 104 is operable to amplify the minute analog signals accessed from disk platter 116. In turn, read channel circuit 102 digitizes and decodes the received analog signal to recreate the information originally written to disk platter 116. This data is provided as read data 122 to a receiving circuit. While processing the read data, read channel circuit 102 encodes and decodes the data using a low density parity check encoder and decoder with embedded or external column rotation circuits. A write operation is substantially the opposite of the preceding read operation with write data 124 being provided to read channel circuit 102.

It should be noted that storage system 100 can be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

In addition, it should be noted that storage system 100 can be modified to include solid state memory that is used to store data in addition to the storage offered by disk platter 116. This solid state memory may be used in parallel to disk platter 116 to provide additional storage. In such a case, the solid state memory receives and provides information directly to read channel circuit 102. Alternatively, the solid state memory can be used as a cache where it offers faster access time than that offered by disk platter 116. In such a case, the solid state memory can be disposed between interface controller 106 and read channel circuit 102 where it operates as a pass through to disk platter 116 when requested data is not available in the solid state memory or when the solid state memory does not have sufficient storage to hold a newly written data set. Based upon the disclosure provided herein, one of ordinary skill in the art will recognize a variety of storage systems including both disk platter 116 and a solid state memory.

Turning to FIG. 2, a wireless communication system 200 or data transmission device including a transmitter 202 with a low density parity check encoder and column rotation and a receiver 204 with low density parity check decoder and column rotation is shown in accordance with some embodiments of the present invention. The transmitter 202 is operable to encode data with a low density parity check encoder with embedded or external column rotation circuit, and to transmit the encoded data via a transfer medium 206. The encoded data is received from transfer medium 206 by receiver 204. Receiver 204 incorporates a low density parity check decoder with embedded or external column rotation circuit to decode and correct errors in the received data.

Turning to FIG. 3, another storage system 300 is shown that includes a data processing circuit 310 having a low density parity check encoder and decoder with embedded or external column rotation circuits in accordance with one or more embodiments of the present invention. A host controller circuit 306 receives data to be stored (i.e., write data 302). This data is provided to data processing circuit 310 where it is encoded using a low density parity check encoder with embedded or external column rotation circuits, adding parity bits. The data to be written is provided to a solid state memory access controller circuit 312. Solid state memory access controller circuit 312 can be any circuit known in the art that is capable of controlling access to and from a solid state memory. Solid state memory access controller circuit 312 formats the received encoded data for transfer to a solid state memory 314. Solid state memory 314 can be any solid state memory known in the art. In some embodiments of the present invention, solid state memory 314 is a flash memory. Later, when the previously written data is to be accessed from solid state memory 314, solid state memory access controller circuit 312 requests the data from solid state memory 314 and provides the requested data to data processing circuit 310. In turn, data processing circuit 310 decodes the data with a low density parity check decoder with embedded or external column rotation circuits. The resulting data are provided to host controller circuit 306 where the data is passed on as read data 304.

A low density parity check code is defined by a sparse parity check matrix H of size m×n, where m<n. A code word c of length n satisfies all the m parity check equations defined by H, i.e., $cH^T=0$, where 0 is a zero vector. Low density parity check codes are Shannon capacity approaching as n increases. In addition, low density parity check codes are relatively friendly to highly parallel decoder implementation.

Figure 4:
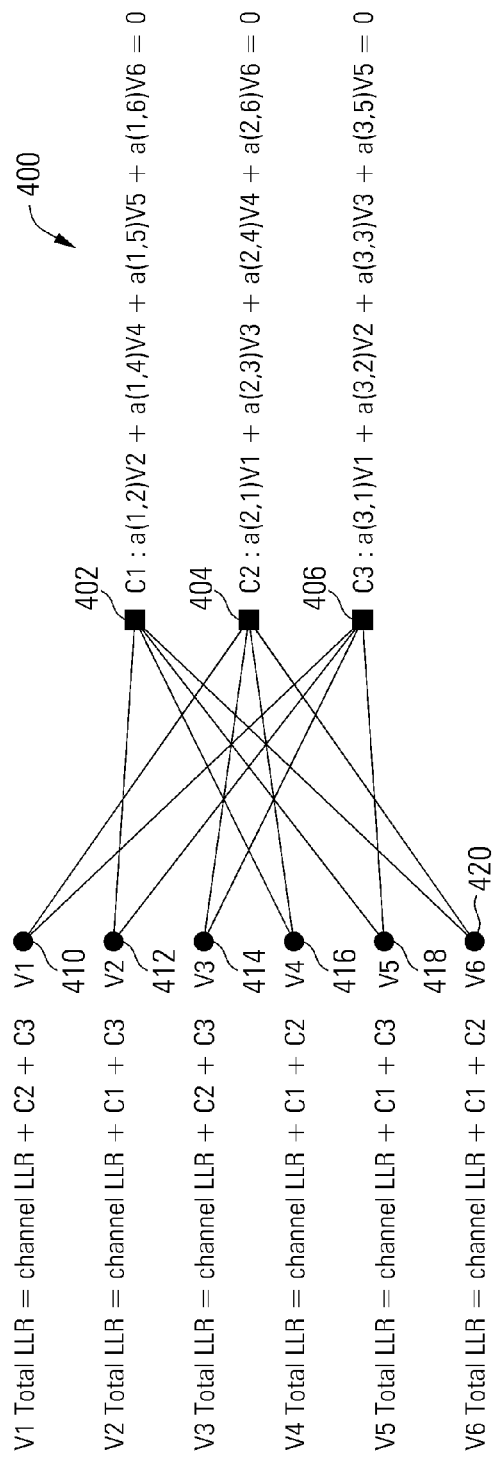
FIG. 4 depicts a Tanner graph of a simplified portion of a low density parity check code that can be used with column rotation to encode and decode data in accordance with some embodiments of the present invention.

Low density parity check codes are also known as graph-based codes with iterative decoding algorithms, which can be visually represented in a Tanner graph 400 as illustrated in FIG. 4. In a low density parity check decoder, multiple parity checks are performed in a number of check nodes (e.g., 402, 404 and 406) for a group of variable nodes (e.g., 410, 412, 414, 416, 418, and 420). The connections (or edges) between variable nodes 410-420 and check nodes 402-406 are selected as the low density parity check code is designed, balancing the strength of the code against the complexity of the decoder required to execute the low density parity check code as data is obtained. The number and placement of parity bits in the group are selected as the low density parity check code is designed. Messages are passed between connected variable nodes 410-420 and check nodes 402-406 in an iterative process, passing beliefs about the values that should appear in variable nodes 410-420 to connected check nodes 402-406. Parity checks are performed in the check nodes 402-406 based on the messages and the results are returned to connected variable nodes 410-420 to update the beliefs if necessary. Low density parity check decoders can be implemented in binary or non-binary fashion. In a binary low density parity check decoder, variable nodes 410-420 contain scalar values based on a group of data and parity bits that are retrieved from a storage device, received by a transmission system or obtained in some other way. Messages in the binary low density parity check decoders are scalar values transmitted as plain-likelihood probability values or log likelihood ratio (LLR) values representing the probability that the sending variable node contains a particular value. In a non-binary low density parity check decoder, variable nodes 410-420 contain symbols from a Galois Field, a finite field $GF(p^k)$ that contains a finite number of elements, characterized by size $p^k$ where p is a prime number and k is a positive integer. A symbol can have any number of bits. In some embodiments, the non-binary low density parity check decoder uses 2-bit symbols having four possible values, 00, 01, 10, and 11. Messages in the non-binary low density parity check decoders are multi-dimensional vectors, generally either plain-likelihood probability vectors or log likelihood ratio vectors.

The connections between variable nodes 410-420 and check nodes 402-406 may be presented in matrix form as follows, where columns represent variable nodes, rows represent check nodes, and a random non-zero element a(i,j) from the Galois Field at the intersection of a variable node column and a check node row indicates a connection between that variable node and check node and provides a permutation for messages between that variable node and check node:

$$H = \begin{bmatrix} 0 & a(1,2) & 0 & a(1,4) & a(1,5) & a(1,6) \\ a(2,1) & 0 & a(2,3) & a(2,4) & 0 & a(2,6) \\ a(3,1) & a(3,2) & a(3,3) & 0 & a(3,5) & 0 \end{bmatrix} \quad (Eq\ 1)$$

For example, in some embodiments of a GF(4) decoder with circulant size 4, each Galois field element a(i,j) specifies a shift for the corresponding circulant matrix of 0, 1, 2 or 3.

By providing multiple check nodes 402-406 for the group of variable nodes 410-420, redundancy in error checking is provided, enabling errors to be corrected as well as detected. Each check node 402-406 performs a parity check on bits or symbols passed as messages from its neighboring (or connected) variable nodes. In the example low density parity check code corresponding to the Tanner graph 400 of FIG. 4, check node 402 checks the parity of variable nodes 412, 416, 418 and 420. Values are passed back and forth between connected variable nodes 410-420 and check nodes 402-406 in an iterative process until the low density parity check code converges on a value for the group of data and parity bits in the variable nodes 410-420, or until a maximum number of iterations is reached. For example, variable node 410 passes messages to check nodes 404 and 406, referred to herein as variable node to check node messages or V2C messages. Check node 402 passes messages back to variable nodes 412, 416, 418 and 420, referred to herein as check node to variable node messages or C2V messages. The messages between variable nodes 410-420 and check nodes 402-406 are probabilities or beliefs, thus the low density parity check decoding algorithm is also referred to as a belief propagation algorithm. Each message from a node represents the probability that a bit or symbol has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed based on the current value of the check node and the last messages to the check node from neighboring variable nodes, except that the last message from that particular variable node is omitted from the calculation to prevent positive feedback. As local decoding iterations are performed in the system, messages pass back and forth between variable nodes 410-420 and check nodes 402-406, with the values in the nodes 402-420 being adjusted based on the messages that are passed, until the values converge and stop changing or until a maximum number of iterations is reached.

Decoder convergence is checked by determining whether the syndrome $s=cH^T$ is all zero. The syndrome is a vector of length m, with each bit corresponding to a parity check. A zero bit in a syndrome means the check is satisfied, while a non-zero bit in the syndrome is an unsatisfied check (USC). By definition, a codeword has syndrome s=0. A non-codeword has a non-zero syndrome. The decoder tests for convergence by monitoring the syndrome weight, or the number of non-zero symbols in the vector. The codeword has converged, or completed decoding, when the syndrome weight is 0. The binary and symbol Hamming weight of the syndrome vector have a similar definition. The binary Hamming weight of the vector is the number of non-zero bits in the vector, whereas the symbol hamming weight is the number of non-zero symbols in the vector. For example, the following vector has 8 symbols of two bits each for a total of 16 bits:

| 01 | 00 | 10 | 00 | 01 | 00 | 00 | 11 |
|----|----|----|----|----|----|----|----| in which the binary Hamming weight, or number of non-zero bits, is 5, and the symbol Hamming weight, or number of non-zero symbols, is 4. In a decoding error event, such as entering a trapping set of a non-binary low density parity check code, the syndrome weight is not the only important factor, the binary Hamming weight is also important.

The performance of a low density parity check code is affected by small weight codewords and trapping sets. For non-binary low density parity check codes, the non-zero elements of each column can be multiplied by elements of the Galois Field to alter the trapping sets/codewords, referred to herein as column rotation.

Given a non-binary low density parity check matrix H, the column rotation can be performed by multiplying matrix H by a diagonal full rank matrix D as follows:

$$Hc = H(DD^{-1})c = (HD)(D^{-1}c) = H'c' \quad \text{(Eq 2)}$$

where c is a codeword of H. H'=HD is a new low density parity check code, derived by multiplying non-zero elements on each column of H by non-zero elements in diagonal column rotation matrix D. Non-zero entries in column rotation matrix D are placed along a diagonal of the matrix, and are selected from the Galois field for the H matrix. In some embodiments the non-zero values in column rotation matrix D are various different elements selected from the Galois field. $c' = D^{-1}c$ is still a codeword or trapping set of H'. H' is referred to herein as a column rotation of non-binary low density parity check code H with respect to D.

Example trapping sets and their rotations are set forth below:

| 01 00 01 00 01 00 00 01 | | 01 00 10 00 11 00 00 11 |
|---|---|---|
| 10 00 10 00 10 00 00 10 | → | 10 00 11 00 01 00 00 01 |
| | column rotation | |
| 11 00 11 00 11 00 00 11 | | 11 00 01 00 10 00 00 10 |

Given a binary symmetric channel (BSC) with a bit error rate p=0.1, the probability of entering the original set of three trapping sets on the left is $2p^4(1-p)^{12}+p^8(1-p)^8=5.6490e^{-5}$. The probability of entering the rotated set of three trapping sets on the right is $2p^5(1-p)^{11}+p^6(1-p)^{10}=6.6249e^{-6}$. Thus, the probability of entering these three example trapping sets is greatly reduced by column rotation.

Column rotation with low density parity check codes also greatly simplifies code optimization for different channel conditions or properties. In channel conditions with low channel bit density, error events are typically shorter than in channel conditions with high channel bit density. Different rotation vectors can be used for low and high channel bit densities. In the write path of the data processing system, the rotation vector D is fetched based on the channel conditions. (Although D is a diagonal full rank rotation matrix, it can also be considered as a rotation vector containing the non-zero entries of the Galois field along the diagonal of the rotation matrix.) After encoding the information is encoded to a codeword c with respect to matrix H, the codeword c is multiplied by the rotation vector, and the resulting $D^{-1}c$, or column rotated codeword, is written to the storage medium or transmitted. Because the matrix D is a diagonal matrix, the multiplication is straightforward. In the read path, the readback data is decoded based in part on the rotation vector D.

Column rotation also helps avoid or reduce the incidence of miscorrection, in which the low density parity check decoder converges on the wrong codeword. That is, when the syndrome s generated by the decoder has a symbol weight of 0, the decoder determines that the codeword resulting from the decoding contains the correct decoded hard decision data. However, some codewords may have a syndrome with a symbol weight of 0 but not correspond to the correct data. Furthermore, retry operations are unlikely to correct miscorrected these codewords when all data sectors are encoded with the same low density parity check code, and retry operations would apply those same low density parity check codes. By applying different column rotation vectors to various sectors, the likelihood of miscorrected codewords is reduced. Each data sectors encoding results c are rotated by a different $D^{-1}$ in the write path. During decoding, column rotation vector D is applied to rotate the H matrix in the decoder. If the column rotation vector D is generated randomly, each data sector can be considered to be encoded with a different parity check matrix HD.

Figure 5:
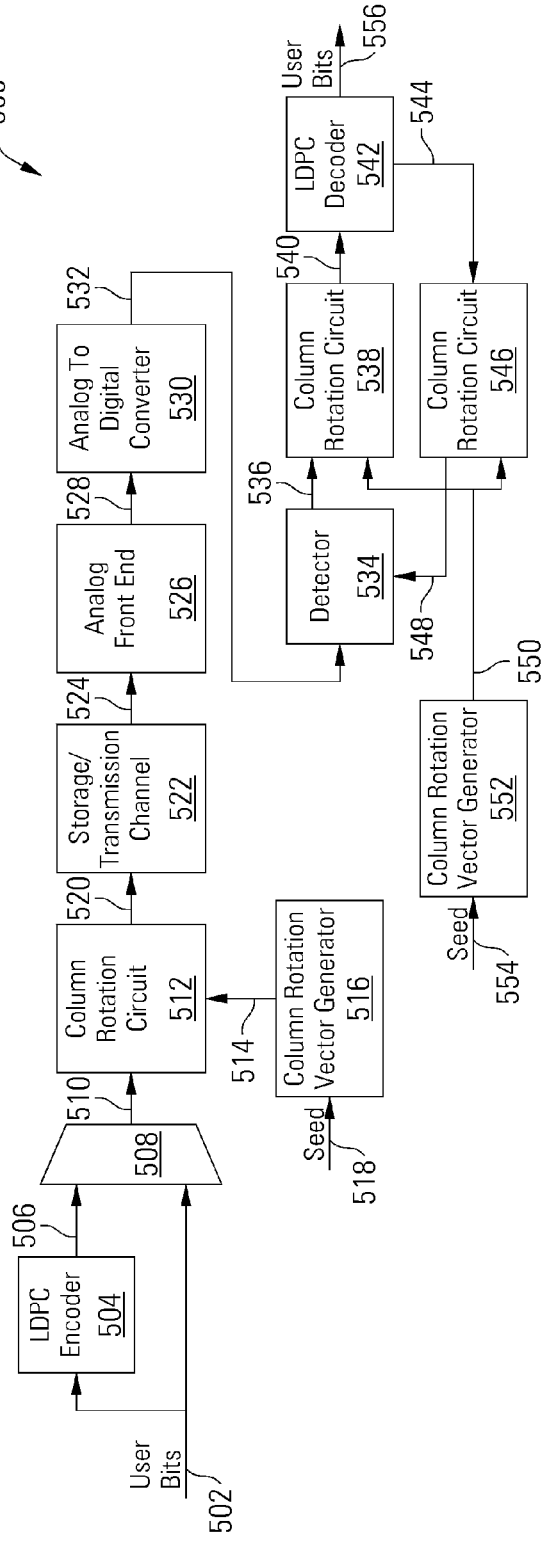
FIG. 5 depicts a read channel with a low density parity check encoder and decoder with column rotation in accordance with some embodiments of the present invention.

Turning to FIG. 5, a read channel 500 is depicted with a low density parity check encoder and decoder with column rotation in accordance with some embodiments of the present invention. User data bits 502 to be stored or transmitted are encoded in a low density parity check encoder 504 according to a parity check H matrix, which produces parity bits 506 for the user data bits 502. The parity bits 506 are combined with the user data bits 502 in a multiplexer 508, yielding encoded data 510. The encoded data 510 is multiplied by a column rotation vector D 514 in a column rotation circuit 512, yielding rotated encoded data 520 which is stored in or transmitted through storage or transmission channel 522.

The column rotation vector D 514 is generated in a column rotation vector generator circuit 516. In some embodiments, the column rotation vector generator circuit 516 randomly generates the column rotation vector D 514, for example using a linear feedback shift register or any other circuit suitable for generating a vector made up of values from a Galois field. The column rotation vector D 514 is generated based on a seed value 518, which can be any value available in both the write and read paths so that the same column rotation vector D 514 can be generated for both encoding and decoding. In some embodiments, the seed value 518 comprises a logic block address (LBA), a value unique to each data sector stored on a magnetic hard drive, although it is not limited to this value. Based upon the disclosure provided herein, one of ordinary skill in the art will recognize a variety of random generator circuits and seed values that may be used to generate the column rotation vector D 514.

An analog signal 524 representing the rotated encoded data 520 is received or retrieved from the storage/transmission channel 522, and is processed in an analog front end circuit 526. The analog front end circuit 526 can include, but is not limited to, an analog filter and an amplifier circuit as are known in the art. The processed analog signal 528 is sampled by an analog to digital converter 530, yielding a corresponding series of digital samples 532. In other embodiments, digital data is retrieved directly from a storage device or other source, such as a flash memory.

Digital samples 532 are provided to a data detector 534, which performs a data detection process on the received input, resulting in a detected data 536. In some embodiments of the present invention, data detector 534 is a Viterbi algorithm data detector circuit, or more particularly in some cases, a maximum a posteriori (MAP) data detector circuit as is known in the art. In some embodiments, the detected data 536 contains log likelihood ratio (LLR) information about the likelihood that each bit or symbol has a particular value. Based upon the disclosure provided herein, one of ordinary skill in the art will recognize a variety of data detectors that may be used in relation to different embodiments of the present invention.

The extrinsic LLR values in the detected data 536 from data detector 534 are multiplied by a column rotation vector D 550 in a column rotation circuit 538, thereby reordering the extrinsic LLRs according to the rotation vector, yielding rotated detected data 540. The column rotation vector D 514 is generated in a column rotation vector generator circuit 552, using the same random generation algorithm as in the write path column rotation vector generator circuit 516. For example, the column rotation vector generator circuit 552 can use a linear feedback shift register or any other circuit suitable for generating a vector made up of values from a Galois field. The column rotation vector D 552 is generated based on the same seed value 554 as in the write path so that the same column rotation vector D 550 is regenerated. In some embodiments, the seed value 518 comprises a logic block address (LBA), a value unique to each data sector stored on a magnetic hard drive, although it is not limited to this value. The column rotation vector generator circuits 516, 552 can be shared or independent.

The rotated detected data 540 is decoded in a non-binary low density parity check decoder 542. Multiple detection and decoding iterations can be performed in the read channel 500, referred to herein as global iterations. (In contrast, local iterations are decoding iterations performed within the low density parity check decoder 542.) To perform a global iteration, log likelihood ratio values 544 from the low density parity check decoder 542 are multiplied by the column rotation vector D 550 in a column rotation circuit 546, yielding rotated decoder output 548. The rotated decoder output 548 are provided again to the data detector 534 to allow the data detector 534 to repeat the data detection process, aided by the rotated decoder output 548. In this manner, the read channel 400 can perform multiple global iterations, allowing the data detector 534 and low density parity check decoder 542 to converge on the correct data values. The low density parity check decoder 542 also produces hard decisions 556 representing the user data bits after the decoding operation is complete.

Figure 6:
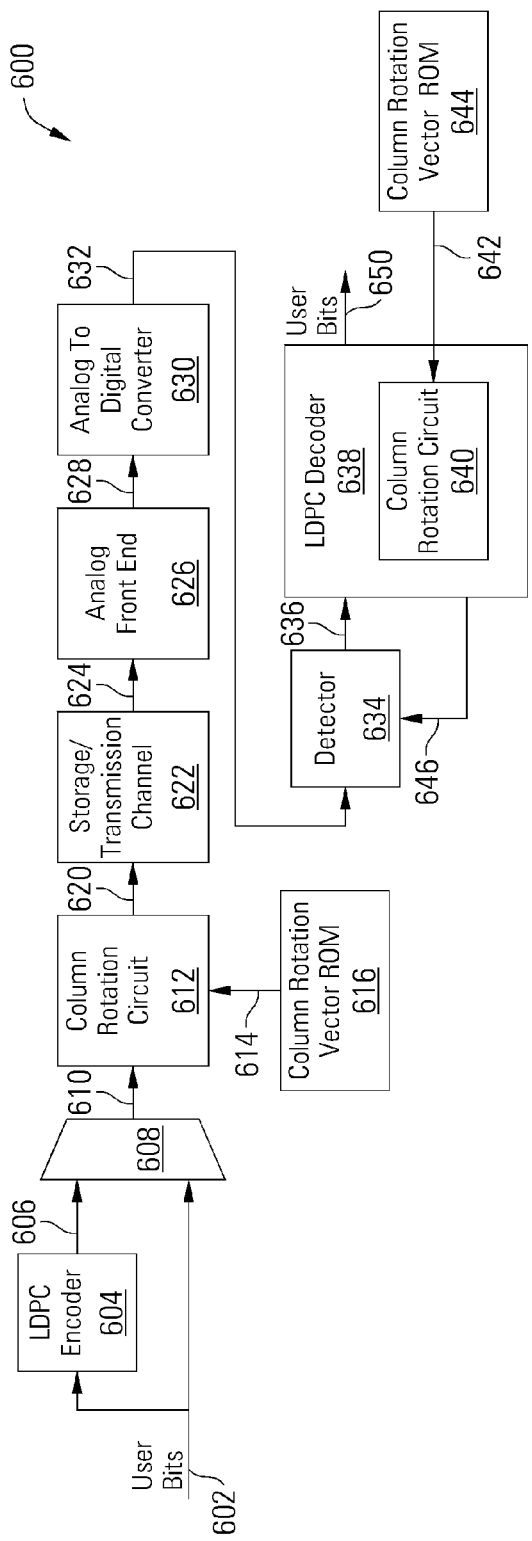
FIG. 6 depicts another read channel with a low density parity check encoder and decoder with column rotation in accordance with some embodiments of the present invention.

Turning to FIG. 6, another read channel 600 is depicted with a low density parity check encoder and decoder with column rotation in accordance with some embodiments of the present invention. In this embodiment, column rotation vectors are generated in advance and stored in a read only memory (ROM) or other memory for use in the write and read paths. User data bits 602 to be stored or transmitted are encoded in a low density parity check encoder 604 according to a parity check H matrix, which produces parity bits 606 for the user data bits 602. The parity bits 606 are combined with the user data bits 602 in a multiplexer 608, yielding encoded data 610. The encoded data 610 is multiplied by a column rotation vector D 614 in a column rotation circuit 612, yielding rotated encoded data 620 which is stored in or transmitted through storage or transmission channel 622.

The column rotation vector D 614 is generated in a column rotation vector generator circuit 616. In some embodiments, the column rotation vector generator circuit 616 randomly generates the column rotation vector D 614 based on a seed value 618.

An analog signal 624 representing the rotated encoded data 620 is received or retrieved from the storage/transmission channel 622, and is processed in an analog front end circuit 626. The processed analog signal 628 is sampled by an analog to digital converter 630, yielding a corresponding series of digital samples 632. In other embodiments, digital data is retrieved directly from a storage device or other source, such as a flash memory.

Digital samples 632 are provided to a data detector 634, which performs a data detection process on the received input, resulting in a detected data 636. The detected data 636 from data detector 634 is decoded in a non-binary low density parity check decoder 638. Column rotations are performed on the parity check H matrix in a column rotation circuit 640 in the low density parity check decoder 638, based on a column rotation vector 642 retrieved from a column rotation vector read only memory 644, where the column rotation vector 642 for the sector being decoded matches the column rotation vector 614 used to encode the sector in the write path.

Multiple global iterations can be performed in the read channel 600, feeding log likelihood ratio values 646 from the low density parity check decoder 638 back to the data detector 634 to guide subsequent data detection. The low density parity check decoder 638 also produces hard decisions 650 representing the user data bits after the decoding operation is complete.

The column rotation applied in the embodiment of FIG. 5 reorders the detector and decoder extrinsic log likelihood ratio values according to the column rotation vector. This multiplies D by $D^{-1}c$ so that the resulting vector can be decoded with the parity check H matrix. The column rotation applied in the embodiment of FIG. 6 applies the column rotation to the parity check H matrix, yielding a rotated parity check matrix HD, which is used in the low density parity check decoder. These two embodiments, which apply column rotations to the codeword and the H matrix, respectively, are equivalent.

Figure 7:
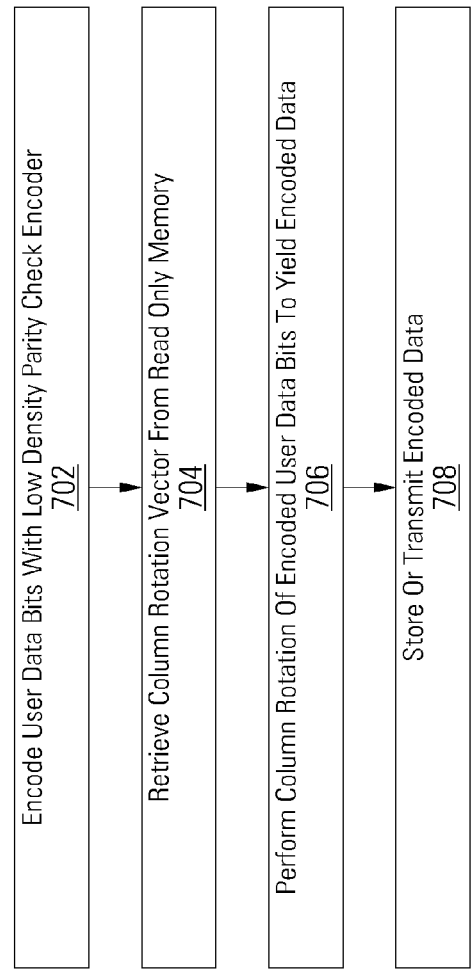
FIG. 7 is a flow diagram of an operation to encode data with a low density parity check encoder and column rotation circuit with column rotation vector read only memory in accordance with some embodiments of the present invention.

Turning to FIG. 7, a flow diagram 700 depicts an operation to encode data with a low density parity check encoder and column rotation circuit, retrieving a column rotation vector from a read only memory in accordance with some embodiments of the present invention. Following flow diagram 700, user data bits are encoded with a low density parity check encoder. (Block 702) A column rotation vector is retrieved from a read only memory. (Block 704) The read only memory can store multiple pre-generated column rotation vectors, selected in any suitable manner based on the data sector being encoded. For example, the logic block address can be used as an index to the column rotation vectors in the read only memory. A column rotation is applied to the encoded user data bits to yield encoded data. (Block 706) The encoded data can then be stored or transmitted. (Block 708)

Figure 8:
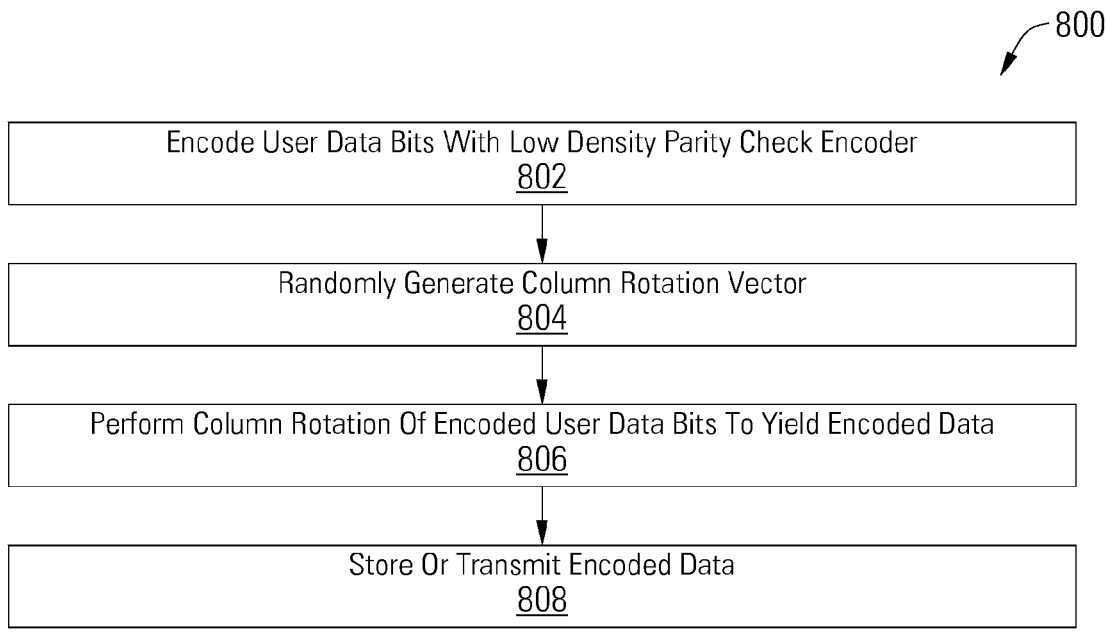
FIG. 8 is a flow diagram of an operation to encode data with a low density parity check encoder and column rotation circuit with a random column rotation vector generator in accordance with some embodiments of the present invention.

Turning to FIG. 8, a flow diagram 800 depicts an operation to encode data with a low density parity check encoder and column rotation circuit, generating a column rotation vector with a random column rotation vector generator in accordance with some embodiments of the present invention. Following flow diagram 800, user data bits are encoded with a low density parity check encoder. (Block 802) A column rotation vector is randomly generated. (Block 804) A column rotation is applied to the encoded user data bits to yield encoded data. (Block 806) The encoded data can then be stored or transmitted. (Block 808)

Figure 9:
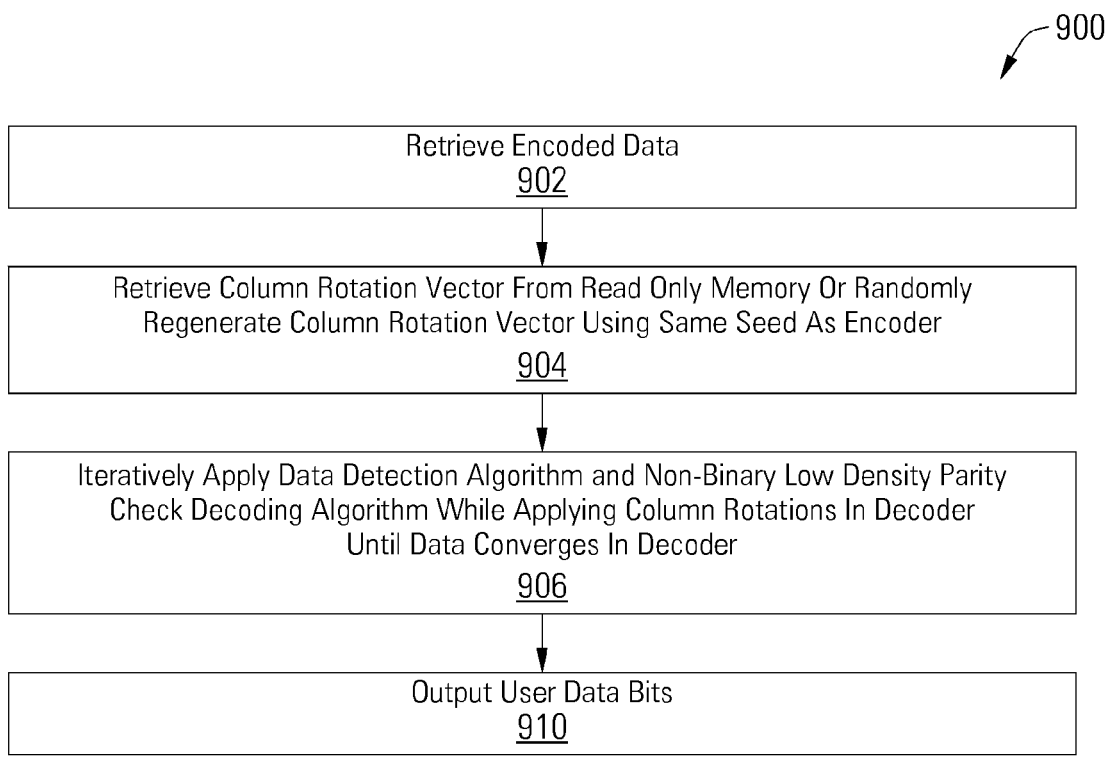
FIG. 9 is a flow diagram of an operation to decode data with a detector and a low density parity check decoder while applying column rotations to an H matrix in the decoder in accordance with some embodiments of the present invention.

Turning to FIG. 9, a flow diagram 900 depicts an operation to decode data with a detector and a low density parity check decoder while applying column rotations to an H matrix in the decoder in accordance with some embodiments of the present invention. Following flow diagram 900, encoded data is retrieved. (Block 902) The encoded data can be derived from an analog signal read from a magnetic storage device, or received from a transmission medium, etc. A column rotation vector is retrieved from a read only memory or is randomly regenerated using the same seed as for the encoder. (Block 904) A data detection algorithm and non-binary low density parity check decoding algorithm are iteratively applied while applying column rotations in the decoder until data converges in decoder. (Block 906) The resulting user data bits can then be output. (Block 910)

Figure 10:
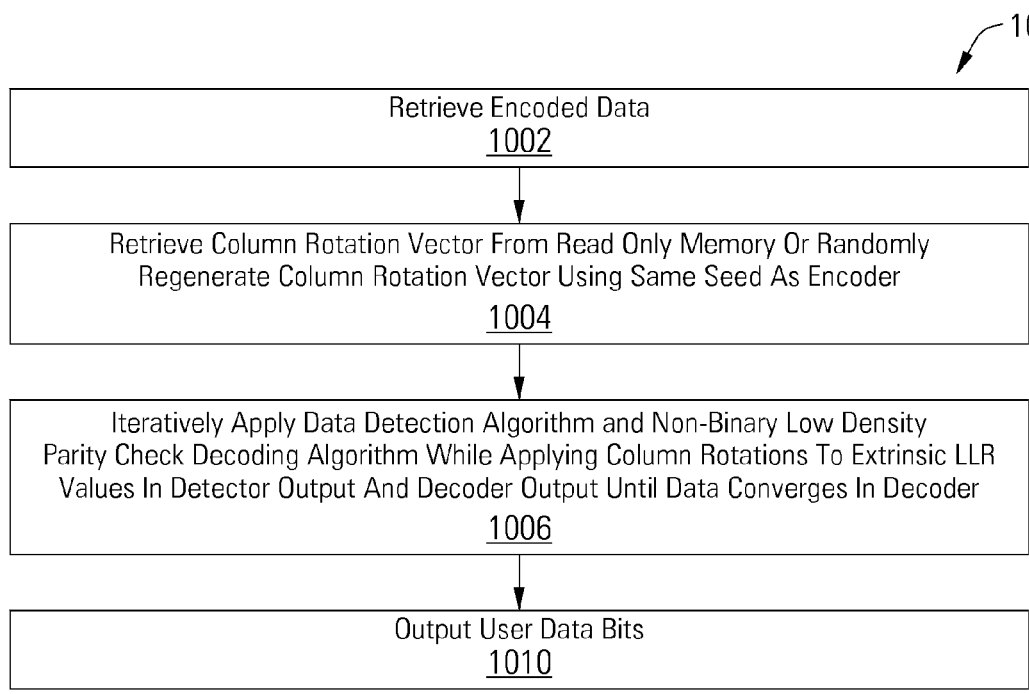
FIG. 10 is a flow diagram of an operation to decode data with a detector and a low density parity check decoder while applying column rotations to extrinsic LLR values in the detector and decoder outputs in accordance with some embodiments of the present invention.

Turning to FIG. 10, a flow diagram 1000 depicts an operation to decode data with a detector and a low density parity check decoder while applying column rotations to extrinsic LLR values in the detector and decoder outputs in accordance with some embodiments of the present invention. Following flow diagram 1000, encoded data is retrieved. (Block 1002) The encoded data can be derived from an analog signal read from a magnetic storage device, or received from a transmission medium, etc. A column rotation vector is retrieved from a read only memory or is randomly regenerated using the same seed as for the encoder. (Block 1004) A data detection algorithm and non-binary low density parity check decoding algorithm are iteratively applied while applying column rotations to extrinsic LLR values in the detector output and the decoder output until data converges in the decoder. (Block 1006) The resulting user data bits can then be output. (Block 1010)

Figure 11:
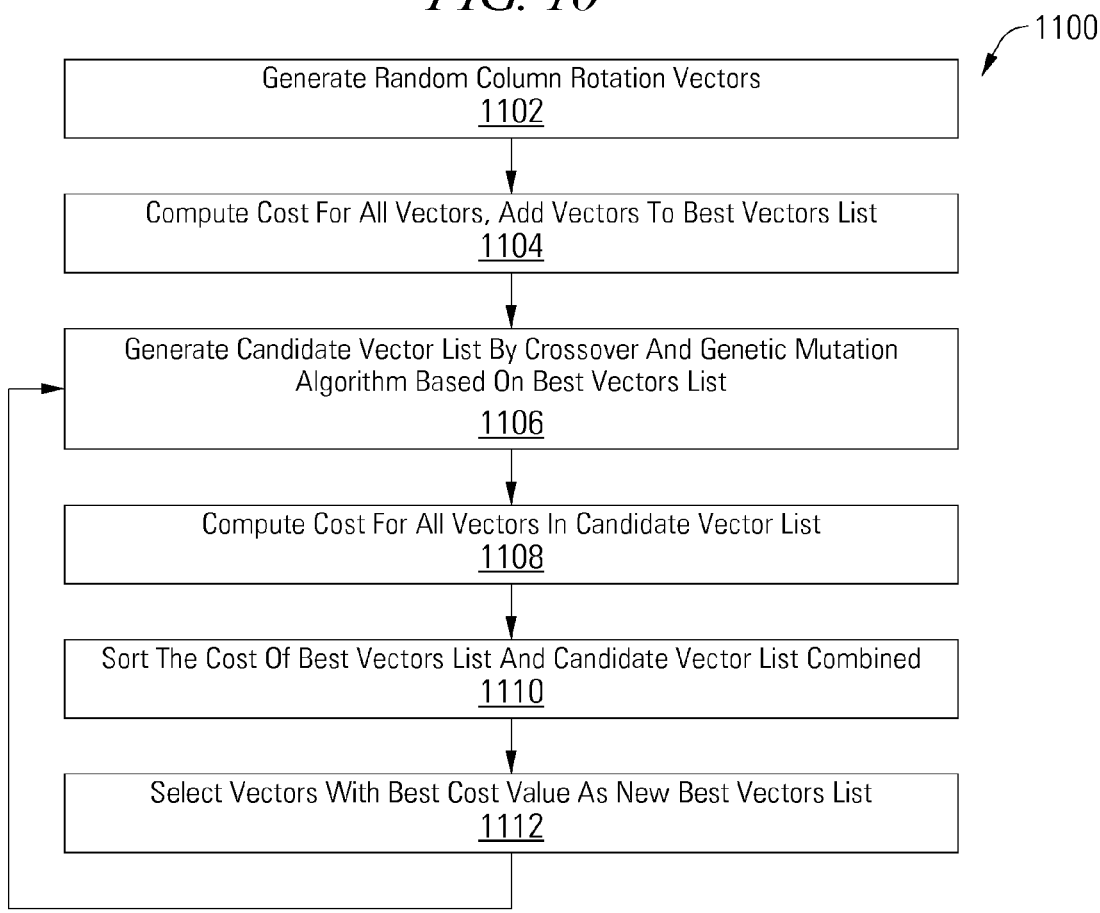
FIG. 11 is a flow diagram of an operation to generate rotation vectors using a cost function and genetic mutation algorithm in accordance with some embodiments of the present invention.

Turning to FIG. 11, a flow diagram 1100 depicts an operation to generate rotation vectors using a cost function and genetic mutation algorithm in accordance with some embodiments of the present invention. In some embodiments, the cost function is selected to optimize the rotation vectors according to a trapping set, although any function could be used for sorting and selecting candidate column rotation vectors. An example cost function that can be used is:

$$\text{Cost} = \sum_{T_i} \frac{1}{w(T_i)} p^{H(T_i)} \quad \text{(Eq 3)}$$

where Ti is a trapping set list being targeted by the cost function, obtained offline, where w(Ti) is the symbol weight of the trapping set, and where H(Ti) is the Hamming weight of the trapping set.

The operation is initialized by generating a number of random column rotation vectors, in which vector elements denote the element of the Galois field multiplying on each column of the H matrix. (Block 1102) The cost is computed for the initial column rotation vectors and the vectors are added to a best vectors list. (Block 1104) The column rotation vectors are then optimized according to the cost function by generating a candidate vector list based on the best vectors list, for example using crossover and mutation, a genetic modification algorithm. (Block 1106) The cost of all vectors in the candidate vector list is computed. (Block 1108) The vectors in the best vectors list and candidate vector list combined are sorted by cost. (Block 1110) A subset of all vectors in the best vectors list and candidate vector list combined is selected. (Block 1112) For example, in some embodiments, 50 column rotation vectors are randomly generated for the initial best vector list in Block 1102, 400 candidate vectors are generated in Block 1106, and 50 vectors are selected to replace the best vectors list based on the sorted costs in Block 1112. The optimization process can be continued at Block 1106 for as long as desired, for example until repetitions start to yield limited improvement. For example, the optimization process can be limited by comparing the difference in one or more vector costs in the best vector list from one iteration to the next and halting once the difference is below a threshold.

The column rotation disclosed herein for non-binary low density parity check encoding and decoding achieves the performance of multiple low density parity check with the hardware complexity of a single low density parity check code. The method can be generalized to other error events and metrics than the trapping sets, miscorrected codewords and cost function disclosed herein.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, embodiments of the present invention provide novel systems, devices, methods and arrangements for encoding and decoding with low density parity check codes and column rotations. While detailed descriptions of one or more embodiments of the invention have been given above, various alternatives, modifications, and equivalents will be apparent to those skilled in the art without varying from the spirit of the invention. Therefore, the above description should not be taken as limiting the scope of embodiments of the invention which are encompassed by the appended claims.

What is claimed is:

1. An apparatus comprising:
    a storage medium operable to store encoded data; and
    a read channel circuit comprising a low density parity check encoder operable to encode data to generate the encoded data, and a low density parity check decoder operable to decode the encoded data retrieved from the storage medium, wherein the read channel circuit is operable to perform a column rotation on the encoded data prior to storage and after retrieval before decoding the encoded data, wherein the column rotation comprises reordering extrinsic log likelihood ratios according to a rotation vector.

2. The apparatus of claim 1, wherein the low density parity check decoder comprises a non-binary decoder.

3. The apparatus of claim 1, wherein the column rotation comprises multiplying each non-zero entry in a column of a low density parity check H matrix by a constant from a Galois Field.

4. The apparatus of claim 1, wherein the read channel circuit comprises a data detector circuit configured to perform global detection and decoding iterations with the low density parity check decoder.

5. The apparatus of claim 4, wherein the read channel circuit further comprises a first column rotation circuit configured to perform the column rotation on an output of the data detector circuit and a second column rotation circuit configured to perform the column rotation on an output of the low density parity check decoder.

6. The apparatus of claim 1, wherein the read channel circuit comprises a column rotation circuit configured to perform the column rotation on an output of the low density parity check encoder.

7. The apparatus of claim 1, wherein the low density parity check decoder comprises a column rotation circuit configured to perform the column rotation on an H matrix.

8. The apparatus of claim 1, the read channel circuit further comprising a read only memory operable to contain at least one rotation vector.

9. The apparatus of claim 8, wherein the at least one rotation vector comprises a plurality of rotation vectors, each comprising a Galois Field value for each column in an H matrix.

10. The apparatus of claim 1, wherein the read channel circuit is operable to generate a rotation vector used for the column rotation based on a seed.

11. The apparatus of claim 1, wherein the read channel circuit is operable to select from among a plurality of rotation vectors based at least in part on a channel bit density.

12. A method of encoding and decoding data, comprising:
encoding data according to a low density parity check matrix to yield encoded data;
performing a column rotation of the encoded data using a rotation vector to yield column-rotated encoded data;
performing a column rotation of the column-rotated encoded data to yield the encoded data;
decoding the encoded data according to the low density parity check matrix to yield the data;
retrieving the rotation vector from a read only memory from among a plurality of rotation vectors based at least in part on a channel bit density; and
optimizing the plurality of rotation vectors based on a trapping set list for the low density parity check matrix.

13. The method of claim 12, further comprising storing the column-rotated encoded data on a storage medium.

14. The method of claim 12, wherein the rotation vector comprises a Galois Field value for each circulant column in the low density parity check matrix.

15. The method of claim 12, wherein the plurality of rotation vectors are optimized based on a symbol weight and a hamming weight of the trapping set list.

16. The method of claim 12, further comprising generating the rotation vector based upon a seed value prior to the column rotations.

17. A storage system comprising:
a storage medium;
a low density parity check encoder operable to encode user data to be stored on the storage medium;
a read channel circuit operable to perform column rotations of encoded user data, wherein the column rotation comprises reordering extrinsic log likelihood ratios according to a rotation vector;
the read channel circuit further operable to perform column rotations of the encoded data after retrieval from the storage medium; and
a low density parity check decoder operable to decode the encoded user data from the storage medium.

18. The storage system of claim 17, wherein the low density parity check decoder comprises a non-binary decoder.

19. The storage system of claim 17, wherein the read channel circuit comprises a data detector circuit configured to perform global detection and decoding iterations with the low density parity check decoder.

20. The storage system of claim 19, wherein the read channel circuit further comprises a first column rotation circuit configured to perform the column rotation on an output of the data detector circuit and a second column rotation circuit configured to perform the column rotation on an output of the low density parity check decoder.

* * * * *